United States Patent [19]

Robb et al.

[11] Patent Number: 5,115,369
[45] Date of Patent: May 19, 1992

[54] AVALANCHE STRESS PROTECTED SEMICONDUCTOR DEVICE HAVING VARIABLE INPUT IMPEDANCE

[75] Inventors: Stephen P. Robb, Tempe; John P. Phipps, Phoenix; Michael D. Gadberry, Tempe, all of Ariz.

[73] Assignee: Motorola, Inc., Schaumburg, Ill.

[21] Appl. No.: 637,719

[22] Filed: Jan. 7, 1991

Related U.S. Application Data

[62] Division of Ser. No. 474,889, Feb. 5, 1990, Pat. No. 5,005,061.

[51] Int. Cl.⁵ .................. H02H 9/02; H03K 17/08; G05F 1/63
[52] U.S. Cl. .................. 361/93; 361/57; 323/289; 307/570
[58] Field of Search .................. 361/93, 1, 91, 98, 58, 361/54, 57, 31; 323/282, 284, 289; 307/239, 248, 570

[56] References Cited

U.S. PATENT DOCUMENTS

| | | | |
|---|---|---|---|
| 3,947,727 | 3/1976 | Stewart | 361/91 |
| 4,845,420 | 7/1989 | Oshizawa et al. | 323/284 |
| 4,893,158 | 1/1990 | Mihara et al. | 361/91 |
| 4,950,930 | 8/1990 | Patni | 307/570 |
| 4,993,396 | 2/1991 | Miura | 307/570 |

*Primary Examiner*—A. D. Pellinen
*Assistant Examiner*—Richard Elms
*Attorney, Agent, or Firm*—Joe E. Barbee; Stuart T. Langley

[57] ABSTRACT

A power transistor having a control electrode which is coupled to a polysilicon JFET transistor is provided. In particular, a power MOSFET device having a polysilicon gate is formed and a JFET transistor is formed in the same polysilicon layer which forms the gate of the power MOSFET. A drain of the JFET forms an input terminal for the power MOSFET and a source of the JFET is coupled to the gate of the power MOSFET. A gate of the JFET is coupled to a gate-drain diode clamp so that when the gate-drain diode clamp is activated a portion of the current which is used to turn on the power MOSFET is channeled to the gate of the JFET and increases the drain-to-source series resistance of the JFET. The resistance of the JFET is low during normal operation and increases only when the gate-drain clamp is activated thus provides a high resistance during avalanche stress protection and a low resistance during normal operation.

7 Claims, 2 Drawing Sheets

AVALANCHE STRESS PROTECTED SEMICONDUCTOR DEVICE HAVING VARIABLE INPUT IMPEDANCE

This is a division of application Ser. No. 07/474,899, filed Feb. 5, 1990, now issued as U.S. Pat. No. 5,005,061.

BACKGROUND OF THE INVENTION

This invention relates, in general, to semiconductor devices, and more particularly, to a monolithic polysilicon junction field effect transistor (JFET) and a method of integration with a power transistor to achieve a variable input impedance which is useful in protecting the power transistor.

In the past, several schemes have been used to protect semiconductor devices from potentially destructive voltages and currents. Such conditions are commonly encountered in the application of power semiconductor devices. For example, a power semiconductor device such as a power MOSFET, is frequently used to switch inductive loads. When the power MOSFET is switched off, the energy stored in the inductor will force the drain voltage of the power MOSFET to rise rapidly above the supply voltage. If no limiting means are employed, this rise will continue until the drain source avalanche voltage of the power MOSFET is reached, whereupon the energy stored in the inductor will be dissipated in the power MOSFET during device avalanche. Such dissipation leads to conduction in an internal parasitic bipolar transistor of the power MOSFET and can cause avalanche stress induced failure of the power MOSFET.

A more manageable form of stress commonly occurs in the operation of power semiconductor devices as the device switches current on and off within its normal mode of conduction. Such operation of a power MOSFET occurs when the current in the power MOSFET channel region is under the control of a gate of the power MOSFET. In this state, the internal parasitic bipolar transistor is non-conductive and device conduction stress can be regulated by appropriately modulating the signal on the power MOSFET gate. It is understood in the art of power MOSFET design and processing that the device conduction stress is less potentially destructive than device avalanche stress.

Various processing techniques are commonly employed to render the internal parasitic elements of the power MOSFET less susceptible to avalanche stress induced failure. A problem with these techniques is that normal variation in the processing parameters of a power MOSFET may inhibit operation or reduce the effectiveness of these techniques.

Other methods of protection involve the use of external devices to render the power MOSFET less susceptible to avalanche stress. One such method uses an external clamp diode whose avalanche voltage is less than that of the power MOSFET connected between the drain and source of the power MOSFET. When the rising drain-source voltage reaches the avalanche voltage of the drain-source clamp diode, the energy stored in the inductor is dissipated in the external drain-source clamp diode rather than the power MOSFET. This method requires the use of relatively large external drain-source clamp diodes which may, in fact, be more expensive than the power switching device which they are protecting. While the drain-source clamp diode is dissipating the inductive energy, the power MOSFET is idle.

A more advantageous method of protection involves diverting a small fraction of the inductive energy to the power MOSFET gate by means of a drain-gate clamp diode whose avalanche voltage is slightly less than the avalanche voltage of the power MOSFET. When a gate-drain diode clamp is used a resistor is coupled between the gate and source of the power MOSFET to dissipate any leakage current through the gate-drain clamp diode without activating the MOSFET gate. It is also desirable to place a blocking diode in series with the gate-drain clamp to block current flow from a gate signal source to the drain. This is often the case as typical gate-source voltages may be in the range of 10–40 volts while drain-source on-voltages may be only a few volts.

In operation, when a rising drain-source voltage exceeds the avalanche voltage of the drain-gate clamp diode, a current flows through the clamp diode. This current develops a voltage across the gate-source resistor which acts to turn the power MOSFET on. The gate-source voltage continues to rise until the power MOSFET is passing all of the stored inductive energy. Using this method, the power MOSFET dissipates the inductive energy in the less stressful conduction mode.

This protection scheme is usually implemented with discrete components connected externally to a power transistor. A monolithic integratable version of the draingate clamp protection method is described in co-pending U.S. application Ser. No. 278,988 which is owned by the same assignee as the present invention, and incorporated herein by reference. The integrated drain-gate clamp of the above identified application provides effective protection for the power device.

A convenient and effective way to drive the gate of the MOSFET when a gate-drain clamp is used calls for a series gate resistance to be connected between the power MOSFET gate and the gate signal source. This arrangement is useful in that the gate signal source is not loaded by the gate-source resistor when the power MOSFET is turned on, either in normal operation or avalanche mode operation. This series resistance also ensures the gate signal source does not draw current from the drain-gate clamp during an avalanche stress condition. If the signal source does draw current from the drain-gate clamp it becomes difficult or impossible to effectively turn the gate of the power transistor on when clamping is required. The series resistance, however, slows switching of the power MOSFET. Thus, this protection method offers outstanding protection against avalanche stress at the expense of degrading switching speed during normal operation.

Accordingly, it is an object of the present invention to provide a protection circuit for a power transistor comprising a variable input impedance.

Another object of the present invention is to provide a protection circuit for a power transistor which does not degrade switching speed of the power transistor.

Another object of the present invention is to provide a polycrystalline junction field effect transistor which can be used to provide variable input impedance.

Another object of the present invention is to provide an integratable monolithic variable resistance which is compatible with power MOSFET processing.

SUMMARY OF THE INVENTION

These and other objects and advantages of the present invention are provided by a power transistor having a control electrode which is coupled to a polysilicon JFET transistor. In particular, a power MOSFET device having a polysilicon gate is formed and a JFET transistor is formed in the same polysilicon layer which forms the gate of the power MOSFET. A drain of the JFET forms an input terminal for the power MOSFET and a source of the JFET is coupled to the gate of the power MOSFET. A gate of the JFET is coupled to a gate-drain diode clamp so that when the gate-drain diode clamp is activated a portion of the current which is used to turn on the power MOSFET is channeled to the gate of the JFET and increases the drain-to-source series resistance of the JFET. The resistance of the JFET is low during normal operation and increases only when the gate-drain clamp is activated thus provides a high resistance during avalanche stress protection and a low resistance during normal operation. The low resistance provides increased switching speed for the power MOSFET.

DETAILED DESCRIPTION OF THE DRAWINGS

Figure 1A:
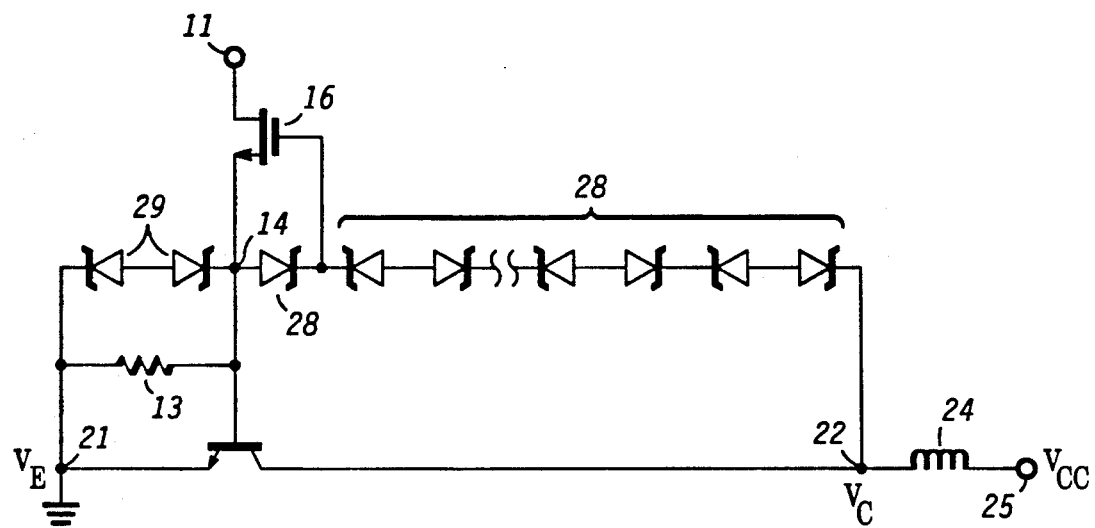
FIG. 1a illustrates a schematic diagram of the variable impedance protection circuit of the present invention using a bipolar transistor.
Figure 1B:
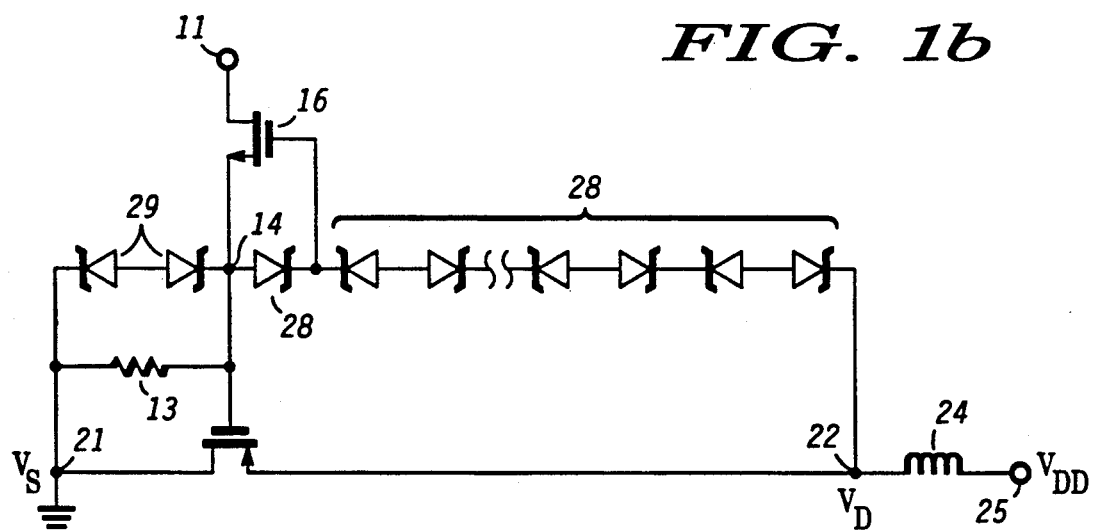
FIG. 1b illustrates a schematic diagram of the variable impedance protection circuit of the present invention using an insulated gate bipolar transistor.
Figure 1C:
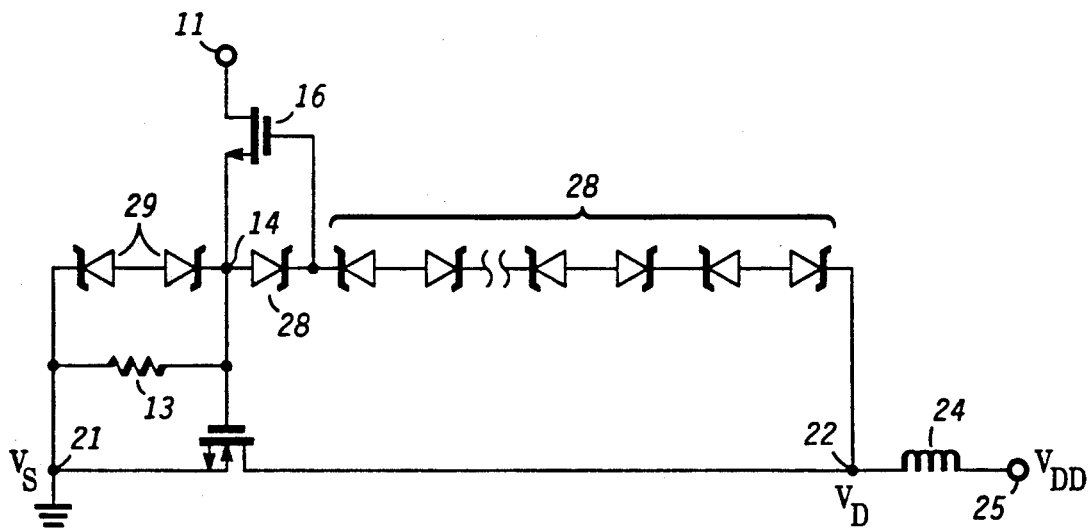
FIG. 1c illustrates a schematic diagram of the variable impedance protection circuit of the present invention using a MOSFET transistor.

FIGS. 1a, 1b, and 1c illustrate a circuit diagram of an embodiment of the present invention. A power MOSFET will be used to illustrate where the present invention may be integrated as shown in FIG. 1c, however, the invention is not limited to this specific device. The present invention can be used in other semiconductor devices, such as bipolar transistors as shown in FIG. 1a, insulated gate bipolar transistors shown in FIG. 1b (IGBTs), thyristors, and the like. The MOSFET of FIG. 1c has a gate 14, a source electrode 21, and a drain electrode or current carrying electrode 22. In a bipolar device the gate would correspond to a base, the source to an emitter, and the drain to a collector. The source and drain, or the collector and emitter are current carrying electrodes, while the gate and base are control electrodes.

The power MOSFET is illustrated switching an inductive load 24, attached to a supply voltage 25. A drain-gate clamp scheme is provided by placing a series of back to back clamp diodes 28 between gate 14 and drain 22. Clamp diodes 28 are a series of low voltage diodes coupled in series to provide a cumulative breakdown voltage which is slightly less than the drain-to-source breakdown voltage of the power MOSFET. The plurality of diodes 28 clamps the MOSFET sustaining voltage to the total avalanche voltage of the diodes.

When diodes 28 avalanche, a portion of the inductive current stored in inductive load 24 is conducted through diodes 28 to gate 14. Gate protection diodes 29 and resistor 13 are coupled between gate 14 and source 21. As current flows through diodes 28 it is coupled to protection diodes 29 and resistor 13 and a voltage develops between gate 14 and source 21. This voltage turns on the power MOSFET and causes current to flow from drain 22 to source 21 with the power MOSFET in the conduction mode. Thus, the power MOSFET dissipates any inductive flyback energy, such as found when switching inductive loads, in the conduction mode, rather than in the more stressful avalanche mode.

Protection diodes 29 serve to discharge static charge which may develop during manufacture and handling of the power MOSFET, as well as protect against any voltage spikes on gate 14. Resistor 13 is necessary to draw off any charge build up on gate 14 caused by leakage of clamp diodes 28. Especially at high temperatures, clamp diodes 28 will have a significant leakage current even when an avalanche stress condition does not exist. This leakage current, if not drawn off gate 14, could cause spurious turn on of the power MOSFET.

Junction field effect transistor (JFET) 16 has a source coupled to gate 14 and a gate coupled to protection diodes 28. JFET 16 is normally on and is conveniently a P-channel JFET when an N-channel MOSFET is used. The gate of JFET 16 is illustrated as being coupled one diode drop 28 above gate 14 of the power MOSFET, and so one diode drop 28 above the source of the JFET. The drain of JFET 16 forms a control input, or input terminal 11 which is analogous to the gate input of an unprotected power MOSFET. In normal operation, a control signal is applied to input terminal 11 to modulate current flowing between drain 22 and source 21.

When the present invention is built as an integrated circuit, it is conveniently packaged in a three terminal package having gate, drain, and source terminals which are analogous to conventional power MOSFET packages. Thus, from a user's viewpoint, the protected MOSFET of the present invention is used just as an unprotected MOSFET would be used, but will be more rugged and reliable.

When avalanche current flows through protection diodes 28 a portion of the current is drawn off by the gate of JFET 16. The voltage on the gate of the JFET will rise to one diode drop 28 above its source and pinch off a channel of JFET 16. When this occurs, the drain-to-source resistance of JFET 16 increases dramatically and impedes current flow from gate 14 to input terminal 11, even when input terminal 11 is at a lower potential than gate 14. In this manner, gate 14 can develop a voltage to turn on the power MOSFET and dissipate the inductive current. It should be noted that while the gate of JFET 16 is illustrated as being coupled one diode drop above its source, any number of diode drops can be used depending on the gate-source breakdown voltage of JFET 16. When JFET 16 is built using the same processes as protection diodes 28, it is best to limit the gate of JFET 16 to one diode drop above its source. In fact, the gate of JFET 16 may be coupled to other control circuitry so that the drain to source resistance of JFET 16 can be controlled independently of the operating conditions of the power MOSFET.

Figure 2:
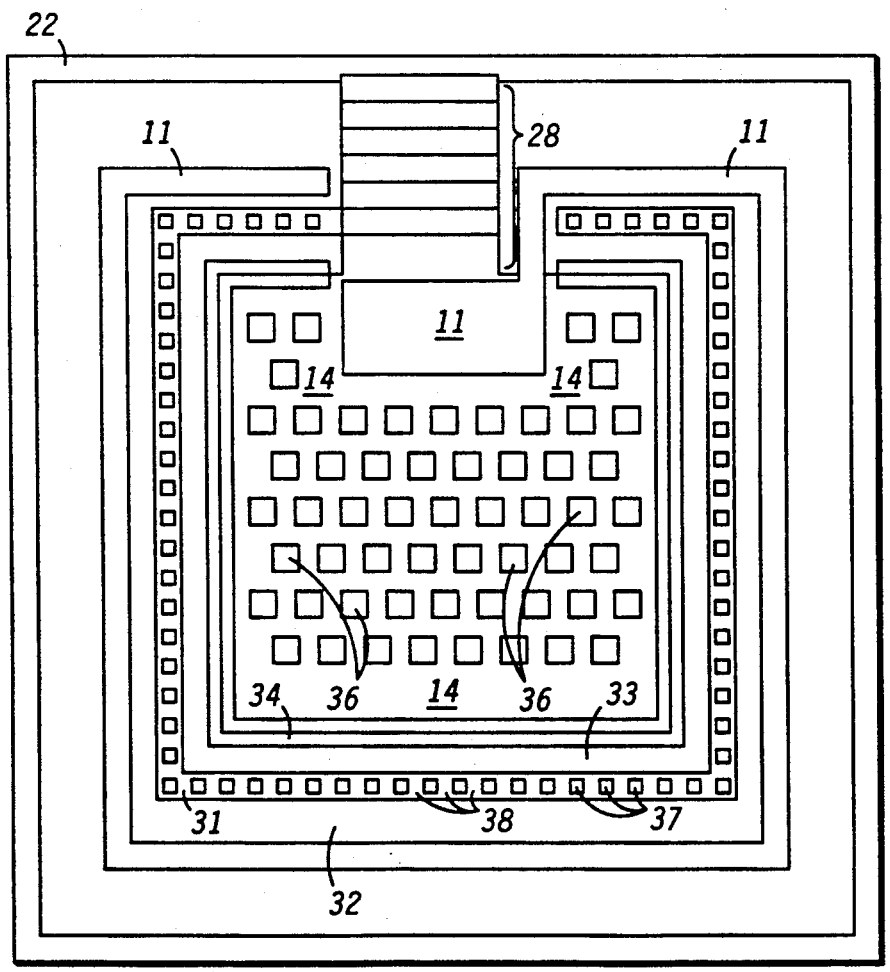
FIG. 2 illustrates a plan view of the surface of an integrated circuit implementing the circuit shown in FIG. 1.

FIG. 2 illustrates a plan view of a portion of an integrated circuit shown in the FIG. 1 schematic diagram. Source metallization for the power MOSFET which is normally formed over power MOSFET cells 36 and MOSFET gate 14 has been removed in FIG. 2 for ease of illustration. Power MOSFET cells 36 can be formed using a variety of process methods which are well known in the art. Power MOSFET cells 36 are formed towards the interior of the integrated circuit and will normally occupy a majority of the surface area of the circuit. MOSFET gate 14 surrounds each cell 36 and for an N-channel MOSFET usually comprises N-type polysilicon.

A polysilicon layer which makes up MOSFET gate 14 extends outward at least to input terminal 11. Although this is a single polysilicon layer, MOSFET gate 14 is doped N-type for an N-channel MOSFET while the portion of the polysilicon layer extending beyond shorting bar 34 is doped P-type. The junction formed where the N-type portion of the polysilicon layer and P-type portion of the polysilicon layer join is shorted by shorting bar 34. A plurality of N-type JFET gate regions 37 are formed surrounding shorting bar 34. N-type JFET gate regions 37 form gates of the JFET 16 shown in FIG. 1.

To minimize the number of process steps it is desirable to form both the N-type and P-type portions of the polysilicon during doping processes which are already used to make the power MOSFET. To do this, after the polysilicon layer is deposited and patterned, a P-type dopant such as boron is implanted with a concentration of about $1 \times 10^{15}$ atoms/cm$^2$ to $1 \times 10^{17}$ atoms/cm$^2$ into the polysilicon layer. This dopant concentration is typically used to form a channel region of the power MOSFET, and so is available to use in the JFET process without an additional step. An oxide layer is then formed over the polysilicon layer and patterned to expose JFET gate regions 37, MOSFET gate 14, and source regions of the MOSFET. JFET gate regions 37 can then be implanted or diffused during the same doping operation which is used for the MOSFET source and MOSFET gate 14.

Gate regions 37 are interconnected by gate interconnect 31 and coupled to clamp diodes 28. Clamp diodes 28 are formed between MOSFET gate 14 and drain ring 22 which surrounds the device. A method for forming gate drain clamp diodes 28 is described in co-pending application Ser. No. 278,988 referenced hereinbefore. Conveniently, clamp diodes 28 are formed in the polysilicon layer and comprise alternating P-type and N-type regions. The P-type regions of clamp diodes 28 are formed at the same time as JFET drain 32, source 33 and channel 38. The N-type portions of clamp diodes 28 are formed simultaneously with N-type JFET gate regions 37. One advantage of using polysilicon to form clamp diodes 28 is that they are easily formed as temperature compensated diodes as a result of their back-to-back diode structure, as described in co-pending application Ser. No. 278,988. Clamp diodes 28 are coupled to drain electrode 22 and to MOSFET gate 14. Since input electrode 11 does not contact MOSFET gate 14 directly, clamp diodes 28 do not contact MOSFET gate 14 directly either.

The P-type portion of the polysilicon layer is thus divided by JFET gate regions 37 and channel regions 38 which lie between each of the JFET gate regions 37. Channel regions 38 lie underneath gate interconnect 31. The interior portion of the P-type region forms JFET source 33 while the exterior portion forms JFET drain 32. Input terminal 11 surrounds JFET drain 32 and is coupled to JFET drain 32. It can be seen that current flowing from input terminal 11 must pass through JFET channels 38 in order to reach MOSFET gate 14. Shorting bar 34 serves to couple JFET source 33 directly to MOSFET gate 14.

JFET channels 38 remain in a low resistance state as long as no voltage is applied from gate regions 37 to source region 33. In normal operation current does not flow through clamp diodes 28 and so JFET gate interconnect 31 remains at the same potential as the JFET source 33. In this condition JFET channel regions 38 allow current to pass through unimpeded, and any signal which is present on input terminal 11 is coupled to MOSFET gate 14. In this state channel regions 38 have a drain-to-source resistance of a few tens of ohms to a few hundred ohms, depending on the resistivity of JFET channel regions 38 and spacing of JFET gate regions 37.

In an avalanche condition, current flows through clamp diodes 28 and thus a voltage is applied to JFET gate interconnect 31 and gate diffusions 37. Voltage on JFET gate interconnect 31 remains one diode drop above MOSFET gate 14. In this condition, JFET channel regions 38 shrink and become more resistive. Ideally, JFET gate regions 37 are spaced and the resistivity of channel regions 38 is chosen so that channel regions 38 pinch off completely when a voltage is applied to JFET gate interconnect 31. It should be noted, however, that so long as the resistance between drain 32 and source 33 increases when a voltage is applied on JFET interconnect 31 the JFET will effectively impede current flow between input terminal 11 and MOSFET gate 14. This in turn allows a voltage to develop on MOSFET gate 14 as charge flows directly from clamp diodes 28 to MOSFET gate 14. As this voltage develops the power MOSFET is turned on as described hereinbefore and protects the power MOSFET from the overvoltage condition.

Thus, in non-avalanche conditions series gate impedance added by the JFET is only a few tens of ohms. However, when an avalanche stress condition exists the impedance between input terminal 11 and MOSFET gate 14 increases by a factor of six or more. The lower impedance during normal operation allows for faster switching of the MOSFET device while the higher impedance during avalanche stress allows the MOSFET gate to be turned on even when input terminal 11 is at a voltage which is lower than the threshold for the MOSFET. The gate drive circuit, which would be coupled to input terminal 11, can not divert the clamp current which flows through clamp diodes 28 and thus prevent the MOSFET from turning on.

By now it should be appreciated that an improved, rugged power transistor has been provided having a variable input impedance. Variable impedance is achieved by forming a polysilicon JFET in series with the polysilicon gate of a power MOSFET. The polysilicon JFET is coupled to an integrated gate to drain clamp so that the JFET pinches off, or becomes more resistive, when the gate clamp is activated. The polysilicon JFET allows the MOSFET to operate at higher switching speeds during normal operation due to low series gate resistance, while allowing for fast and effective turn on during an avalanche stress condition.

We claim:

1. A method of protecting a power transistor having a control electrode and first and second current carrying electrodes, comprising the steps of: providing a first means for passing current from the first current carrying electrode to the control electrode when an avalanche stress condition exists; providing a variable resistance which is controlled by the first means for passing current, wherein the variable resistance is coupled in series with the power transistor control electrode; and increasing the variable resistance when current flows in the first means for passing current.

2. The method of claim 1 further comprising the step of providing a second means for passing current coupled to the control electrode and to the second current carrying electrode, wherein the second means for passing current draws off leakage current when an avalanche stress condition does not exist and allows a voltage to develop between the control electrode and the second current carrying electrode when an avalanche stress condition does exist.

3. The method of claim 1 wherein the variable resistance is a junction field effect transistor having a source coupled to the control electrode, and a gate coupled to the first means for passing current.

4. The method of claim 1 wherein the first means for passing current comprises at least two temperature compensated diodes, and at least one of the temperature compensated diodes is coupled to the variable resistance and the control electrode of the power transistor.

5. The method of claim 1 wherein the power transistor is a power MOSFET, and the control electrode is a gate of the power MOSFET.

6. The method of claim 1 wherein the power transistor is a bipolar transistor and the control electrode is a base of the bipolar transistor.

7. The method of claim 1 wherein the power transistor is an insulated gate bipolar transistor (IGBT) and the control electrode is a gate of the IGBT.

* * * * *